(12) United States Patent
Maas et al.

(10) Patent No.: US 6,763,036 B1
(45) Date of Patent: Jul. 13, 2004

(54) FRAMER METHOD ARCHITECTURE AND CIRCUIT WITH PROGRAMMABLE SYMBOL SELECTION

(75) Inventors: Michael F. Maas, West St. Paul, MN (US); Edward L. Grivna, Brooklyn Park, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/275,625

(22) Filed: Mar. 24, 1999

(51) Int. Cl.[7] .................................................. H04J 3/07
(52) U.S. Cl. ...................................... 370/470; 370/506
(58) Field of Search ................................ 370/470, 503, 370/505, 500, 509, 510, 305, 304, 306, 511, 512, 513; 375/368, 369, 364

(56) References Cited

U.S. PATENT DOCUMENTS

| | | | | |
|---|---|---|---|---|
| 4,203,008 A | * | 5/1980 | Cohn-Sfetcu et al. | 370/307 |
| 4,674,088 A | * | 6/1987 | Grover | 370/506 |
| 4,748,623 A | * | 5/1988 | Fujimoto | 370/513 |
| 4,984,249 A | * | 1/1991 | Long | 375/293 |
| 5,003,599 A | | 3/1991 | Landry | 380/48 |
| 5,005,191 A | | 4/1991 | O'Connor et al. | 375/116 |
| 5,010,559 A | | 4/1991 | O'Connor et al. | 375/116 |
| 5,014,272 A | * | 5/1991 | Yoshida | 370/513 |
| 5,081,654 A | * | 1/1992 | Stephenson | 370/512 |
| 5,161,124 A | * | 11/1992 | Love | 365/222 |
| 5,204,883 A | * | 4/1993 | Blanc | 375/368 |
| 5,367,544 A | | 11/1994 | Bruekheimer | 375/116 |
| 5,598,424 A | | 1/1997 | Erickson et al. | 371/48 |
| 5,666,547 A | * | 9/1997 | James | 710/58 |
| 5,694,056 A | | 12/1997 | Mahoney et al. | 326/38 |
| 5,790,607 A | | 8/1998 | Burke et al. | 375/355 |
| 5,960,007 A | * | 9/1999 | Grivna | 370/509 |
| 5,982,786 A | * | 11/1999 | Grivna | 370/503 |

OTHER PUBLICATIONS

Edward Grivna, U.S.S.N. 08/976,072, Circuits and Methods for Framing One or More Data Streams, filed Nov. 21, 1997.
Edward Grivna, U.S.S.N. 08/975,644, Circuits and Methods for Framing One or More Data Streams, filed Nov. 21, 1997.

* cited by examiner

*Primary Examiner*—Douglas Olms
*Assistant Examiner*—Ricardo M. Pizarro
(74) *Attorney, Agent, or Firm*—Christopher P. Maiorana, P.C.

(57) ABSTRACT

An apparatus comprising a register circuit, a detector circuit and an output circuit. The register circuit may be configured to present a parallel signal in response to (i) a serial input and (ii) a first clock. The detector circuit may be configured to generate a control signal in response to (i) the parallel signal and (ii) a selection signal. The output circuit may be configured to generate an output in response to (i) the control signal and (ii) the parallel signal.

18 Claims, 4 Drawing Sheets

```
reg     [22:0] rxView, mask, syncChar, syncChar1;
reg     [11:0] match;
reg     [3:0]  framePointer;
reg            syncFound;

integer        i,k;

/*****************************************************************
Look across rxView for sync character. Location encoded in match[11:0].
*****************************************************************/
always @(rxView or hl_taxiN or ps10_12_N)
  begin
    syncChar1 = 23'b0000000000000_110000_0101;    // K28.5+
    match     = 0;
    if(ps10_12_N)
      begin
        syncChar = 23'b00000000000_011000_100011; // "LM"
        mask     = 23'b00000000000_111111_111111;
        for (i=0; i<12; i=i+1)
           match[i] = ~|( (rxView & (mask << i) ) ^ (syncChar << i) );
      end
    else if(!hl_taxiN)
      begin
        syncChar = 23'b0000000000000_11000_10001;  // "JK"
        mask     = 23'b0000000000000_11111_11111;
        for (i=0; i<10; i=i+1)
           match[i] = ~|( (rxView & (mask << i) ) ^ (syncChar << i) );
      end
    else
      begin
        syncChar = 23'b0000000000000_001111_1010;  // K28.5-
        mask     = 23'b0000000000000_111111_1111;
        for (i=0; i<10; i=i+1)
           match[i] = ~|( (rxView & (mask << i) ) ^ (syncChar << i) ) ||
                      ~|( (rxView & (mask << i) ) ^ (syncChar1 << i) );
      end
  end /*****************************************************************
Encode match vector to binary framePointer[3:0]. Any match = syncFound.
*****************************************************************/
always @(match)
  begin
    framePointer = 0;
    syncFound    = 0;
    for (k=0; k<12; k=k+1)
      begin
        framePointer = match[k] ? k : framePointer;
        syncFound    = match[k] ? 1 : syncFound;
      end
  end
```

FIG. 4

FRAMER METHOD ARCHITECTURE AND CIRCUIT WITH PROGRAMMABLE SYMBOL SELECTION

CROSS REFERENCE TO RELATED APPLICATIONS

The present application may relate to co-pending application Ser. No. 08/976,072, filed Nov. 21, 1997 and Ser. No. 08/975,644, filed Nov. 21, 1997, which are each hereby incorporated by reference in their entirety.

FIELD OF THE INVENTION

The present invention relates to framing circuits generally and, more particularly, to a programmable circuit for framing a serial bit stream that operates in a received symbol clock domain.

BACKGROUND OF THE INVENTION

Conventional approaches to framing serial bit streams locate a framing symbol in a high-speed serial clock domain. Framing is accomplished by modifying transitions of the received symbol clock in response to detection of the framing symbol. The symbol clock is stretched or compressed as necessary to maintain the framing of symbols to the symbol clock. Programmable selection of the framing symbol may be accomplished using conventional approaches, but is limited to programming the framing symbol in the high speed clock domain.

Conventional approaches require high-speed logic to implement the framing function. The high speed logic requires additional care in design and results in a circuit that requires high power consumption to frame the serial input. Symbol clock duty cycle discontinuities created by such conventional approaches are problematic to synchronous down-stream processing of the received symbols.

SUMMARY OF THE INVENTION

The present invention concerns an apparatus comprising a register circuit, a detector circuit and an output circuit. The register circuit may be configured to present a parallel signal in response to (i) a serial input and (ii) a first clock. The detector circuit may be configured to generate a control signal in response to (i) the parallel signal and (ii) a selection signal. The output circuit may be configured to generate an output in response to (i) the control signal and (ii) the parallel signal.

The objects, features and advantages of the present invention include providing a framing circuit that may (i) have programmable selection of a framing symbol in a received symbol clock domain, (ii) be implemented without high-speed logic and/or (iii) reduce the impact of duty cycle discontinuities on downstream processing.

BRIEF DESCRIPTION OF THE DRAWINGS

These and other objects, features and advantages of the present invention will be apparent from the following detailed description and the appended claims and drawings in which:

FIG. 4 is a verilog HDL description illustrating one example of the operation of the symbol detector of FIG. 1.

DETAILED DESCRIPTION OF THE PREFERRED EMBODIMENTS

The present invention may implement one or more selectable predefined framing symbols in a framing circuit that may operate in the received symbol clock domain, which generally operates at a lower speed than the incoming serial bit stream. A register having a length greater than the symbol length may be updated by the received symbol clock and may store the most recently received bits of the serial bit stream. A compare logic block may compare the register contents and one or more of several selectable predefined (or programmable) framing symbols to identify an index value. The index value may control a windowing multiplexer which may select the indexed segment of the register as the output of the framing circuit.

Figure 1:
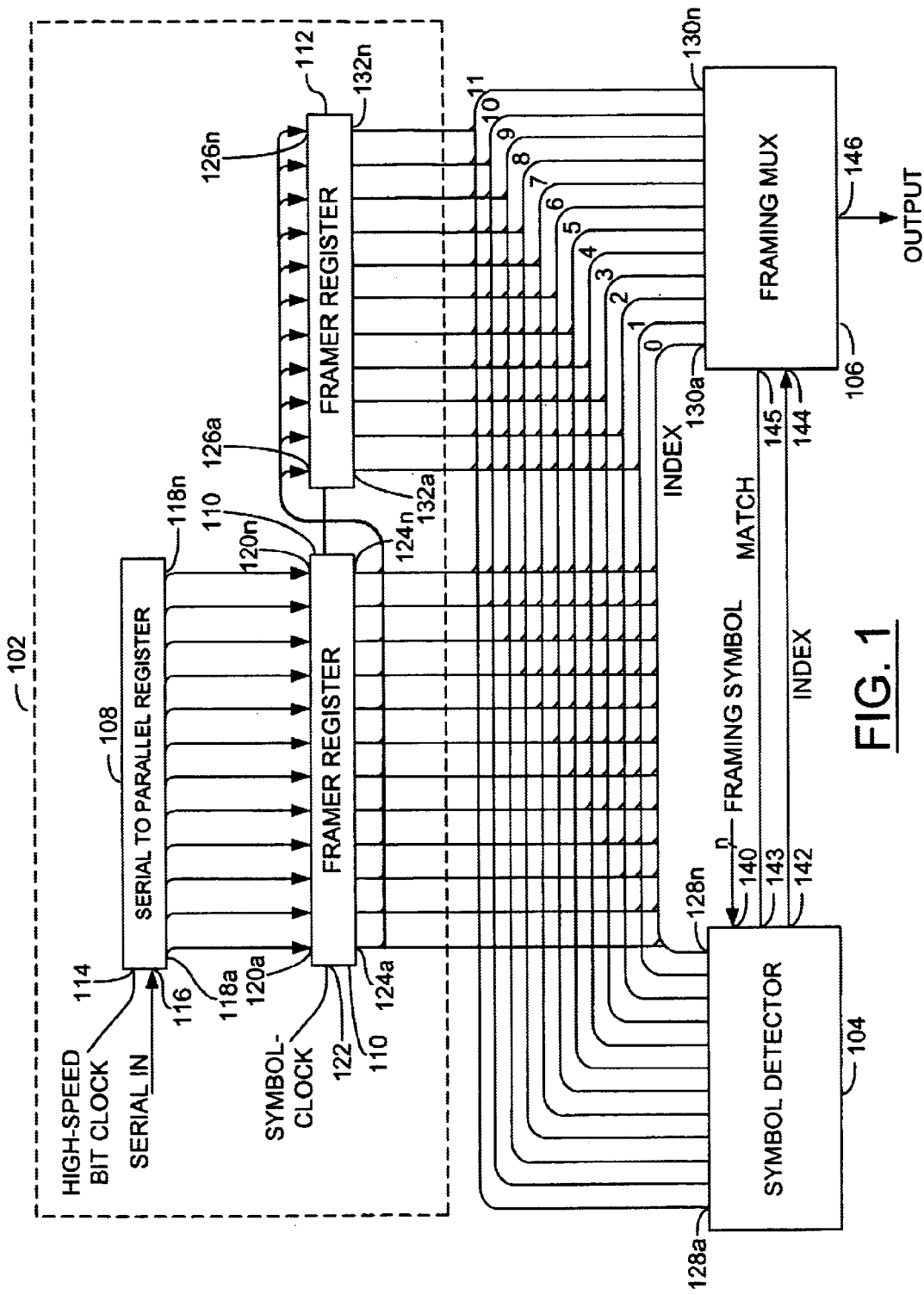
FIG. 1 is a block diagram of a preferred embodiment of the present invention.

Referring to FIG. 1, a block diagram of a circuit 100 is shown in accordance with a preferred embodiment of the present invention. The circuit 100 generally comprises a register section (or circuit) 102, a symbol detector circuit 104 and a multiplexer block (or circuit) 106. The register section 102 generally comprises a register 108, a register 110 and a register 112. The register 108 may be implemented, in one example, as a serial-to-parallel register. The registers 110 and 112 may be implemented, in one example, as parallel registers. The multiplexer 106 may be implemented, in one example, as a framing multiplexer. While FIG. 1 illustrates two registers 110 and 112 as the register section, one or more registers may be implemented accordingly to meet the design criteria of a particular implementation.

The register 108 generally comprises an input 114 that may receive a clock signal (e.g., a high-speed bit clock (HSBC)), an input 116 that may receive an input (e.g., SERIAL_IN). The register 108 generally presents a number of parallel bits at a number of outputs 118a–118n. The number of parallel bits may be received at a number of inputs 120a–20n of the register 110. The register 110 may have an input 122 that may receive a clock signal (e.g., a signal SYMBOL_CLOCK) and may have a number of outputs 124a–24n that may present a parallel output. The signal SYMBOL_CLOCK may be implemented, in one example, as a character clock. The outputs 124a–24n may be presented to a number of inputs 126a–26n of the register 112, a number of inputs 128a–28n of the symbol detector 104 and a number of inputs 130a–30n of the framing multiplexer 106. The register 112 may also have a number of outputs 132a–32n that may be coupled to the inputs 128a–28n of the symbol detector 104 and to the inputs 130a–30n of the framing multiplexer 106.

The outputs 124a–24n and 132a–32n may present particular bits to the inputs 128a–28n and 130a–30n, which may be implemented as multi-bit busses. In the example illustrated in FIG. 1, the input busses 128a–28n and 130a–30n are shown implemented as 12-bit (e.g., <0:11>) busses. However, the particular width of the input busses 128a–28n and 130a–30n may be adjusted accordingly to meet the design criteria of a particular implementation. Similarly, the width of the register 110 (e.g., 12-bits) and the register 112 (e.g., 11-bits) is shown as one example of the registers 110 and 112. Other bit widths may be a chosen to meet the design criteria of a particular implementation.

The symbol detector 104 may also have an input 140 that may receive a signal (e.g., a framing symbol FS) that may be a preprogrammed framing symbol signal. The signal FS may be generated using external signal wires, such as bonding wires, to make the configuration selection. However, alternatives such as register programming, serial stream configuration and fuse technology may be implemented accordingly to meet the design criteria of a particular implementation. For example, the signal FS may be generated from an external circuit (not shown) that may be a read only memory (ROM), a programmable read only memory (PROM), an erasable programmable read only memory (EPROM), a flash memory, or other type of appropriate memory.

The symbol detector 104 may also comprise an output 142 that may present a signal (e.g., INDEX) that may be presented to an input 144 of the framing multiplexer 106 and an output 143 that may present a signal (e.g., MATCH) that may be presented to an input 145 of the framing multiplexer 106. The signal MATCH may be a vector that may indicate a match between the signal FS and the data stored in the registers 110 and 112. The signal INDEX may be a vector that may indicate an offset that may indicate the location of the match within the registers 110 and 112. While the signal INDEX and the signal MATCH are illustrated as two separate vectors, a multi-bit signal may be substituted with a portion representing each signal (e.g., the signal MATCH and the signal INDEX) of the outputs 143 and 144 of the symbol detector 104. The framing multiplexer 106 may also comprise an output 146 that may present a signal (e.g., OUTPUT) that may be a framed output of the input signal SERIAL_IN. The signal OUTPUT is generally a vector. The framing multiplexer 106 generally presents the signal OUTPUT in response to the signal INDEX, the signal MATCH, and the signals received at the inputs 130a–30n.

The circuit 100 illustrates an example of a windowing framer circuit in accordance with a preferred embodiment of the present invention. The signal SERIAL_IN is generally parsed into symbol length parallel words by the register 108. The parallel words may be strobed into the registers 110 and 112 in response to the signal SYMBOL_CLOCK. The symbol detector 104 may compare the outputs of the framer registers 110 and 112 to the signal FS received at the input 140. When a match is detected between framer register contents and the signal FS, the signal INDEX is generally updated, which may provide a new selection vector to the input 144 of the framing multiplexer 106. The new value of the signal INDEX may cause the framing multiplexer 106 to select an index value for which a pattern match was detected.

One advantage of the present invention over a conventional framing approaches is that the present invention may allow the framing function to be performed at the slower symbol clock rate. Framing at a slower speed may allow the circuit 100 to be configured to respond to a synchronizing symbol (e.g., the signal FS) of arbitrary length and pattern received at the input 140.

In one example, the signal FS received at the input 140 may be one of four distinct symbols having one of two lengths. However, the present invention may implement any number of patterns and lengths at the input 140.

Figure 2:
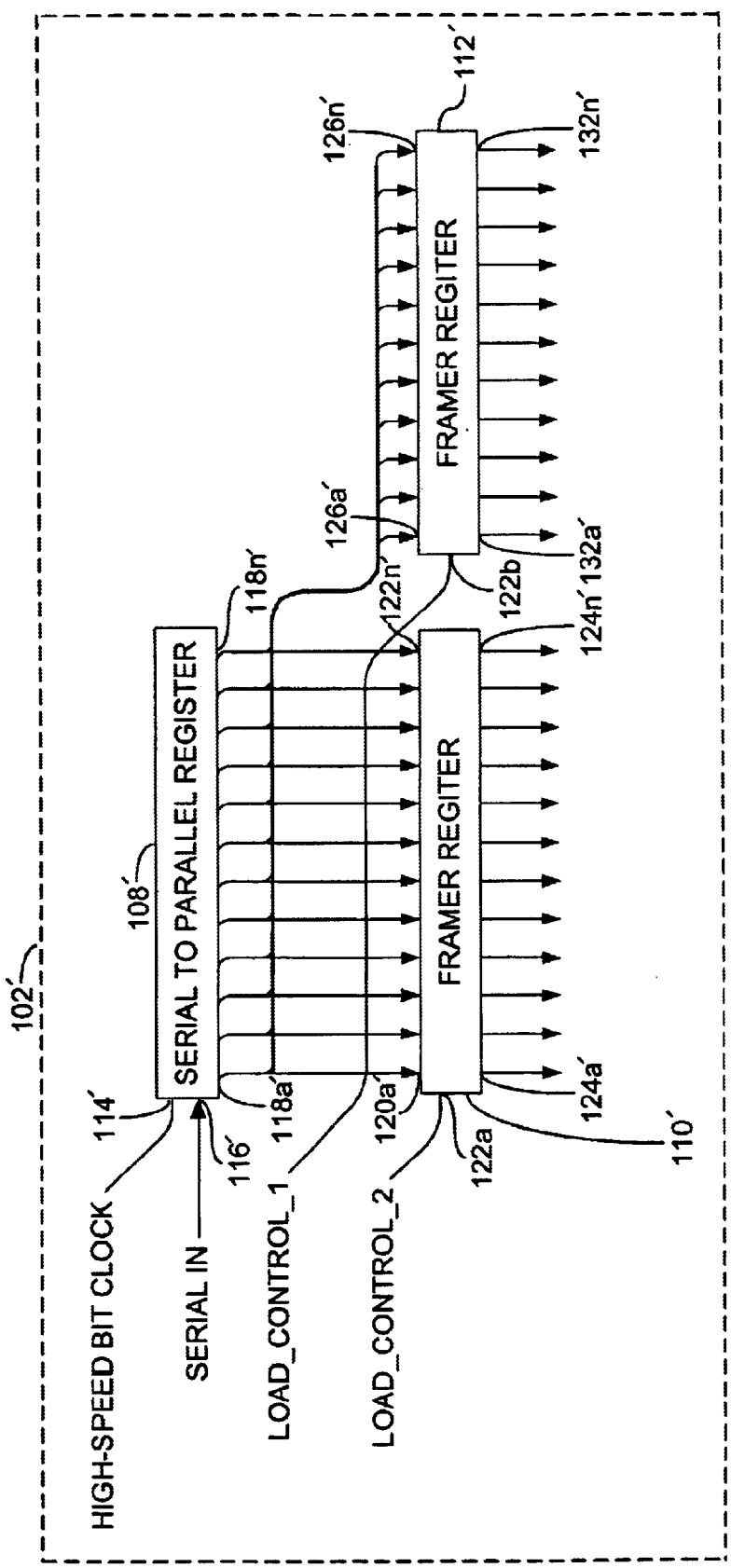
FIG. 2 is a block diagram of an alternate register circuit.

Referring to FIG. 2, an example of an alternate implementation of the register circuit 102' is shown. The register circuit 102' may be an example of a broadcast construction, while the register circuit 102 of FIG. 1 may be an example of a pipeline construction. The register circuit 102' has similar components, labeled with primed reference numbers, as the circuit 102 of FIG. 1. However, the framer register 110' may have an input 122a that may receive a control signal (e.g., LOAD_CONTROL_2) and the framer register 112' may have an input 122b that may receive a control signal (e.g., LOAD_CONTROL_1). While FIG. 2 illustrates an alternate example of the register circuit 102', other alternates of the register circuit 102 may be implemented accordingly to meet the design criteria of a particular implementation.

Figure 3:
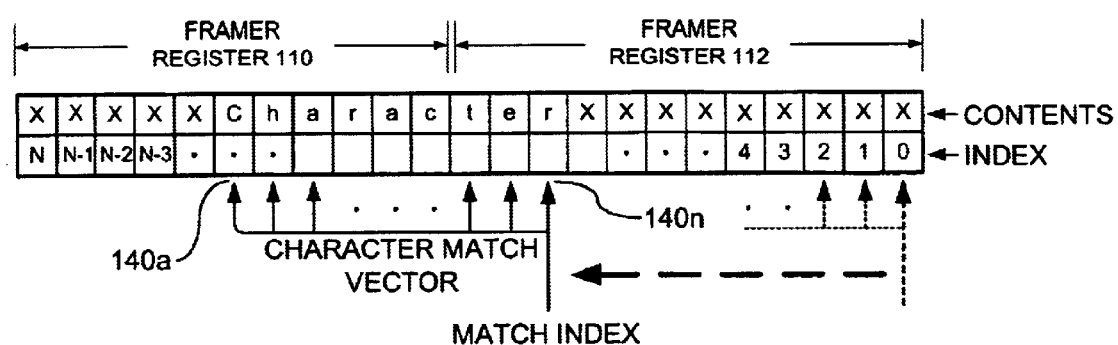
FIG. 3 is a diagram of a history buffer used in the symbol detector of FIG. 1.

Referring to FIG. 3, a functional diagram of the symbol detector 104 is shown illustrated as a history buffer. The framer registers 110 and 112 may be considered as one contiguous buffer containing a history of the received signal SERIAL_IN. FIG. 2 depicts an occurrence of a framing character illustrated as "Character" at an arbitrary location in the history buffer. The history buffer may operate on a periodically updated history of the most recently received serial data that may be stored in the history buffer. The information in the history buffer is typically updated on each transition of the signal SYMBOL_CLOCK. On each update, the symbol detector 104 generally searches for a match between a preselected framing symbol (e.g., the signal received at the input 140) and the contents of the history buffer. When a match is detected, the symbol detector 104 may (i) assert a new value for the signal INDEX, which generally indicates the value in the history buffer at which the match was detected and (ii) toggle the signal MATCH, generally indicating that the signal INDEX has changed. The signal INDEX may be a vector that may define a specified offset that may indicate the location of the received character within the history buffers.

Referring to FIG. 4, a verilog HDL description of the implementation of the symbol detector 104 implemented in FIG. 1 is shown. The syntax of FIG. 4 is understood to be an example of verilog hardware description language (HDL) as defined by the IEEE 1364–1995 standard. However, other implementations of the symbol detector 104 may be substituted accordingly to meet the design criteria of a particular implementation.

Several correspondences between Verilog code labels and previously defined elements can be stated in general terms. The label "rxView" generally corresponds to the framer registers 110 and 112. The label "framePointer" generally corresponds to the signal INDEX of FIGS. 1 and 3. The labels "syncChar" and "syncChar1" generally correspond to specific values of the Character Match Vector (or Framing Symbol) of FIG. 3. The labels "syncFound" and "framePointer" may be the signals MATCH and INDEX, respectively, presented by the symbol detector 104. The code shown in FIG. 4 may use the labels "ps10_12_N" and "h1_taxiN" to select from among three values of "syncChar" identified as "K28.5–", "LM", and "JK". When "K28.5–" is the selected value of "syncChar", a second Character Match Vector, "K28.5+" may be included in the match criteria, allowing a match result if either character is detected in "rxView". Other implementations and variations of the code illustrated in FIG. 4 may be substituted accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:

a register circuit configured to present a parallel signal in response to (i) a serial input and (ii) a first clock;

a symbol detector circuit configured to generate a control signal in response to (i) said parallel signal and (ii) a framing select signal, wherein said symbol detector circuit comprises a buffer configured to generate said control signal in response to a comparison between (i) said parallel signal and (ii) said framing select signal; and a select circuit configured to generate an output in response to (i) said control signal and (ii) said parallel signal.

2. The apparatus according to claim 1, wherein said register circuit generates said parallel signal in further response to a second clock.

3. The apparatus according to claim 2, wherein said first clock comprises a bit clock and said second clock comprises a symbol clock.

4. The apparatus according to claim 2, wherein said control signal comprises a (i) match control signal that indicates a match between said framing select signal and said parallel signal and (ii) an index signal that indicates the location of said framing select signal in said register circuit.

5. The apparatus according to claim 1, wherein said register circuit comprises:

a serial to parallel register; and one or more framing registers.

6. The apparatus according to claim 1, wherein said symbol detector circuit comprises a buffer configured to generate said control signal in response to a comparison between (i) said parallel signal and (ii) said framing select signal.

7. The apparatus according to claim 1, wherein said framing select signal is preprogrammed using bonding wires.

8. The apparatus according to claim 1, wherein said framing select signal is programmed in response to a register.

9. The apparatus according to claim 1, wherein said framing select signal is programmed using one or more fuses.

10. The apparatus according to claim 1, wherein said framing select signal is programmed in response to a serial stream.

11. The apparatus according to claim 1, wherein said framing select signal is programmed in response to a device selected from a group consisting of a programmable read only memory (PROM), an erasable programmable read only memory (EPROM), a flash memory, or other type of appropriate memory.

12. The apparatus according to claim 1, wherein said framing select signal is selected from a group of symbols consisting of four distinct symbols, a symbol having a first length and a symbol having a second length.

13. An apparatus comprising:

means for generating a parallel signal in response to (i) a serial input and (ii) a first clock;

means for generating a control signal in response to (i) said parallel signal, (ii) a framing select signal, wherein said means for generating an output comprises a symbol detection circuit configured to generate said control signal in response to a comparison between (i) said parallel signal and (ii) said framing select signal; and means for generating an output in response to (i) said control signal and (ii) said parallel signal.

14. A method for framing data comprising the steps of:

a) converting a serial input data stream to a parallel data stream in response to a bit clock signal;

b) using a buffer for comparing the parallel data to a framing select signal to generate a control signal; and c) framing said parallel data signal to said symbol clock in response to said control signal, wherein said control signal comprises a (i) match control signal that indicates a match between said framing select signal and said parallel signal and (ii) an index signal that indicates the location of said framing select signal in a register circuit.

15. The method according to claim 14, wherein said parallel data is periodically updated in a buffer.

16. The method according to claim 14, wherein said parallel data stream is generated in further response to a symbol clock.

17. The method according to claim 14, wherein step (b) generates said control signal in response to a comparison between (i) said parallel data signal and (ii) said selected framing signal.

18. An apparatus comprising:

a register circuit configured to present a parallel signal in response to (i) a serial input, (ii) a first clock and (iii) a second clock;

a symbol detector circuit comprising a buffer configured to generate a control signal in response to a comparison between (i) said parallel signal and (ii) a framing select signal; and an output circuit configured to generate an output in response to (i) said control signal and (ii) said parallel signal, wherein said register circuit generates said parallel signal in further response to said second clock wherein said control signal comprises a (i) match control signal that indicates a match between said framing select signal and said parallel signal and (ii) an index signal that indicates the location of said framing select signal in said register circuit.

* * * * *